(12) United States Patent
Tsai (10) Patent No.: US 6,615,157 B1
(45) Date of Patent: Sep. 2, 2003

(54) SYSTEM METHOD AND COMPUTER PROGRAM PRODUCT FOR AUTOMATICALLY ASSESSING EXPERIMENT RESULTS

(75) Inventor: Yuchuan Tsai, Hsinchu (TW)

(73) Assignees: ProMos Technologies, Inc., Hsinchu (TW); Mosel Vitelic Inc., Hsinchu (TW); Siemens AG, Munich (DE)

(*) Notice: Subject to any disclaimer, the term of this patent is extended or adjusted under 35 U.S.C. 154(b) by 0 days.

(21) Appl. No.: 09/525,555

(22) Filed: Mar. 15, 2000

(51) Int. Cl.[7] .............................................. G06F 17/30
(52) U.S. Cl. ......................................... 702/179; 714/54
(58) Field of Search ........................... 702/179, 22, 27, 702/30, 31, 32, 182; 73/863.01; 700/9, 19, 20, 30, 34, 83, 169, 173, 244; 707/102; 714/21, 25, 26, 39, 54; 716/4, 5

(56) References Cited

U.S. PATENT DOCUMENTS

| | | | |
|---|---|---|---|
| 5,946,220 A | * | 8/1999 | Lemelson ................... 210/745 |
| 6,141,608 A | * | 10/2000 | Rother ......................... 701/32 |
| 6,351,683 B1 | * | 2/2002 | Johnson et al. ............. 156/346 |
| 6,359,251 B1 | * | 3/2002 | Picard et al. .......... 219/121.39 |
| 6,389,380 B1 | * | 5/2002 | Bankes .......................... 703/1 |

* cited by examiner

*Primary Examiner*—Marc S. Hoff
*Assistant Examiner*—Edward Raymond
(74) *Attorney, Agent, or Firm*—Alston & Bird LLP (57) ABSTRACT

Systems, methods, and computer program products for analyzing experiment results obtained in a process are provided. The process is conducted separately in a first and second state of a control variable to generate a first and second plurality of experiment data, respectively. The experiment data corresponds to a plurality of attributes of the process. A processor is included in the systems for comparing the first and second plurality of experiment data, and identifying attributes having a statistically significant difference in their corresponding experiment data obtained in the first and second state of the process. The identified attributes are then compared with attributes expected to be affected by changes in the control variable, which are contained in a know-how database, in order to create a conformity database and a non-conformity database.

23 Claims, 6 Drawing Sheets

Figure 1

| | Experiment Data | | | | | | |
|---|---|---|---|---|---|---|---|
| | Fabrication Attributes | | | Electrical Attributes | | | Product Attributes | |
| | Thickness Measurement | Endpoint Time | ---- | Resistance Value | Capacitance Value | Vt | ---- | Yield | Element Schematics | ---- |
| First state result | ---- | | | | | | | | | |
| Second state result | ---- | | | | | | | | | |

| Attribute | Mean Difference | First state result Mean | Second state result Mean | Probability Value |
|---|---|---|---|---|
| ⋮ | ⋮ | ⋮ | ⋮ | ⋮ |
| NMOS current | 0.027 | 0.770 | 0.798 | 0.01 |
| NMOS Vt | 0.012 | 1.108 | 1.119 | 0.06 |
| PMOS current | 0.03 | 0.670 | 0.700 | 0.07 |
| PMOS Vt | 0.031 | -1.080 | -1.111 | 0.08 |
| N + resistance | 1 | 40 | 41 | 0.12 |
| ⋮ | ⋮ | ⋮ | ⋮ | ⋮ |

FIG. 6.

Polycrystalline Silicon Photo Conformity Database

| Control Variable | Attribute |
|---|---|
| Polycrystalline silicon photo | NMOS current, PMOS current |

Figure 7A

Polycrystalline Silicon Photo Non-Conformity Database

Figure 7B

SYSTEM METHOD AND COMPUTER PROGRAM PRODUCT FOR AUTOMATICALLY ASSESSING EXPERIMENT RESULTS

FIELD OF THE INVENTION

This invention relates generally to systems, methods, and computer program products for assessing experiment results and, more particularly, to systems, methods and computer program products for analyzing experiment results obtained in a manufacturing process to determine the effect of a control variable on various attributes of the manufacturing process.

BACKGROUND OF THE INVENTION

Large-scale producers of commercial products typically have a standard manufacturing protocol for each type of product. For example, a semiconductor chip manufacturer making 16 megabit and 64 megabit dynamic random access memory (DRAM) chips usually has a separate protocol for each of the two types of chips. Normally, the standard protocol is constantly modified so as to increase production efficiency and improve product quality.

For purposes of modification, multiple experiments are typically conducted using the standard protocol in which one or more control variables are adjusted and the experiment results are examined. Typically, there are many types of control variables in a manufacturing process that can be adjusted. For example, a semiconductor manufacturing process typically includes control variables such as critical chip dimensions, thickness of a particular metal layer, over-etch time of a particular layer, and the like. Each control variable can be set into a number of different states. Typically, two parallel experimenting processes are conducted in two different states of a particular control variable while the other control variables remain the same in the two processes. Experiment results are collected during and/or after the processes and are examined. For example, to determine the effect of the critical chip dimensions in a 16 MB DRAM chip processing procedure, two parallel processes can be conducted. The only control variable that is set different in the two processes can be the amount of exposure of the chips during the micro-imaging step. After the processes are completed, experiment results are obtained including a variety of experiment data corresponding to a plurality of attributes such as resistance values, capacitance values, yields, etc. The experiment data are analyzed and the analysis results are used as the basis for modifying the standard fabrication protocol.

Normally, a large amount of experiment data is analyzed in order to prevent diagnostic errors. In conventional methods, the experiment data is organized into tables in which the statistical analysis results for certain attributes are indicated. For example, the experiment data can be analyzed to determine the maximum value, minimum value, mean value and maximum difference value corresponding to a particular attribute. The information is included in tables. Engineers then manually examine each of the tables one by one. Normally, there are a large number of tables generated, and engineers often do not have time to examine all the tables and simply rely on personal experience to examine a portion of the tables. For example, an experienced engineer will consider the effects of adjusting the polycrystalline silicon photo on the NMOS and PMOS experiment data. Therefore, they will examine the tables concerning NMOS and PMOS but ignore the experiment data related to other attributes, e.g., the N-shaped well resistance value; which are not expected to be affected by polycrystalline silicon photo.

Conventional methods rely entirely on manual inspection and analysis of experiment data, and thus are extremely time consuming. In addition, conventional methods typically depend on personal experience, and normally only a portion of the experiment data can be examined and analyzed. Unexpected effects are often overlooked. This problem is especially serious with an inexperienced engineer. This results in inadequate consideration of the experiment data and erroneous decisions in the entire fabrication process, often causing significant losses. To aggravate this problem, very often multiple control variables are adjusted in a single experiment, and interactions between the two control variables need to be examined. Conventional methods with manual analysis are not equipped to handle the experiment data in such complex situations.

SUMMARY OF THE INVENTION

The systems, methods and computer program products of this invention can efficiently analyze experiment results, especially in complex situations in which a large number of control variables are adjusted and a large amount of experiment data needs to be analyzed. In accordance with the first aspect of the invention, a system is provided for analyzing experiment results of a plurality of attributes in a process having a control variable. The system includes a processor which compares the experiment results with a know-how database having attributes expected to be affected by changes in the control variable. In one embodiment, two parallel experimenting processes are conducted in two different states of a particular control variable while the other control variables remain the same in the two processes. The experiment results obtained from the two processes are analyzed by a processor included in the system. The processor compares the experiment data from the two processes and identifies those attributes having a statistically significant difference in their corresponding experiment data obtained in the two processes. Such attributes can be organized into an assessment database. Preferably, the processor compares the identified attributes, preferably contained in an assessment database, with a know-how database (e.g., a correlation table provided by process experts indicating the correlation between certain control variables and attributes that are expected to be affected by adjustment of the control variables). The processor then generates a conformity database containing conforming attributes, i.e., those attributes that behave as predicted in the know-how database. A non-conformity database is also generated containing non-conforming attributes, i.e., those attributes on which the effect of the change in the control variable is not the same as predicted in the know-how database.

If the non-conformity database does not contain any attributes, then all attributes for which there are differences are within the expected range. The fact that at least one attribute appears in the non-conformity database would indicate that either an as-yet undiscovered property in the process is found, or an error in the experiment has occurred.

The system may also contain a memory device. Numerical representations of experiment data, analysis results and/or the know-how, conformity, and non-conformity databases can be stored in the memory device. Alternatively the numerical representations can be stored elsewhere, such as within the processor, if so desired.

In accordance with a second aspect of this invention, a computer program product is provided. The computer program product comprises a computer readable storage medium having computer readable program code means embodied in the medium. The computer readable program code means includes computer instruction means for comparing a first and second plurality of experiment data to generate an assessment database. Attributes having a statistically significant difference in their corresponding experiment data in the first and second experiment results are identified in the assessment database. In addition, computer instruction means is also included for comparing the assessment database with a know-how database to generate a conformity database and a non-conformity database.

The computer readable storage medium may be part of the memory device, and when used, the processor of the present invention may implement the computer readable program code means to compare a first and second plurality of experiment data to generate an assessment database, identify attributes having a statistically significant difference in their corresponding experiment data in the first and second experiment results in the assessment database, and to compare the assessment database with a know-how database to generate a conformity database and a non-conformity database.

Accordingly, efficient systems, methods and computer products are provided to analyze complex experiment results. A processor is used to generate various databases and compare the databases. Unexpected experiment results among a large number of experiment data can be accurately and efficiently analyzed and identified for the user.

These and other advantages will be more fully appreciated from the descriptions hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

DETAILED DESCRIPTION OF THE PREFERRED EMBODIMENTS

In the following example, a semiconductor chip fabrication process will be used to illustrate the methods and systems of the present invention. However, it should be understood that this invention is not limited to experimenting in a chip fabrication process. Instead, the present invention can be utilized in conjunction with many other manufacturing processes.

Figure 1:
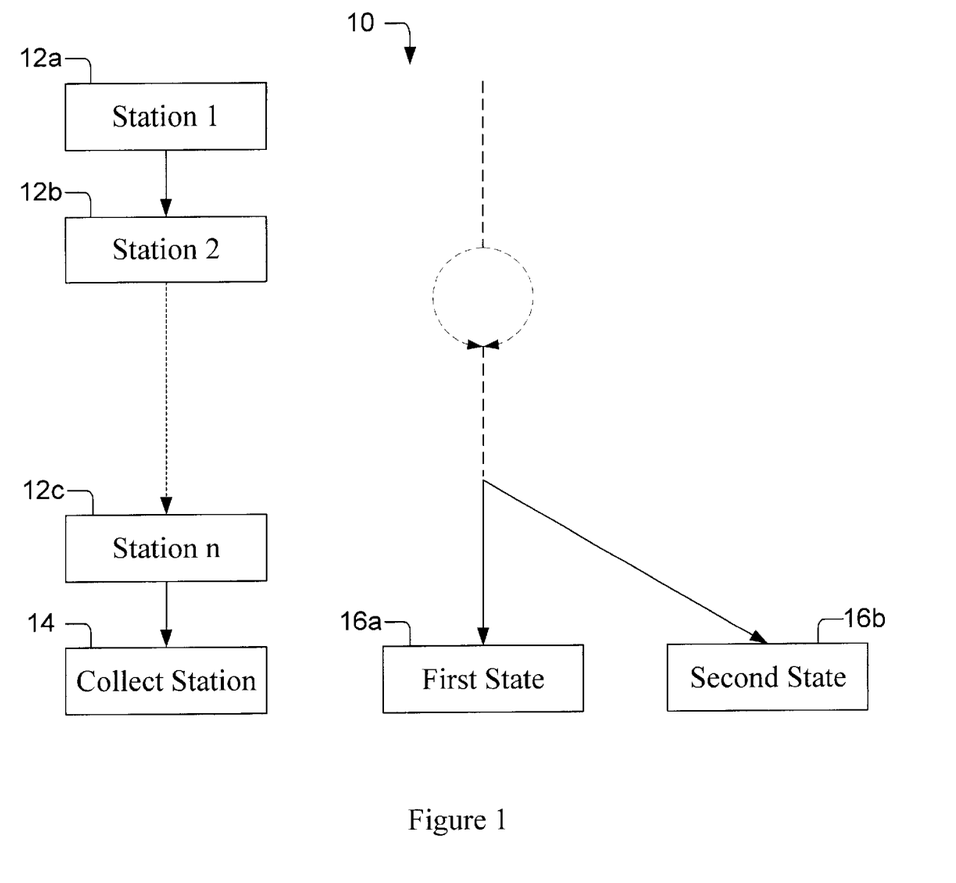
FIG. 1 is an illustration of the experimenting and manufacturing processes of one embodiment of this invention.

FIG. 1 illustrates a experimenting and manufacturing process. The manufacturing process includes multiple control variables that are all parameters in the manufacturing process and can be adjusted. For example, semiconductor fabrication process 10 includes a plurality of stations, e.g., 12a to 12c, with each station being responsible for executing a particular functional objective for the chip. For example, the "n-well micro-image" station indicates that a photoresist layer having an n-well pattern is formed on the chip, whereas the "n-well ion deposit" station indicates that ion implantation is performed on the chip to produce n-wells. After one station completes the intended execution, the chip is sent to the next station. Each of the stations has multiple adjustable control variables, for example, the type of photo-resistance, the thickness of the photo-resistance layer, baking time, amount of exposure, focus, image misalignment, and other control variables. By "control variables" it is intended to mean any parameters in the process that can be adjusted and the results can be compared. Accordingly, suitable control variables are not limited to those within a particular station. For example, the time interval between any two stations can be a control variable that is adjusted in an experimenting process. In conducting experiments for the polycrystalline silicon photo, the effect of changes in polycrystalline silicon photo on the product and components can be monitored. Thus, normally at least two chips are processed in parallel with one control variable changed between the parallel processes. For example, when they are processed at a "polycrystalline silicon micro-image" station, the amount of exposure of the two chips is set different for the two chips so as to obtain two different types of polycrystalline silicon photo.

Moreover, the manufacturing process also includes several experiment data collection stations so that experiment data can be collected representing multiple attributes. For example, a wafer acceptance test (WAT) station can provide experiment data such as current values and capacitance values. Thus, after the two chips have gone through the entire fabrication process, they went through a series of experiment data collection stations 14 such that a first state result 16a including a plurality of experiment data and a second state result 16b including a plurality of experiment data are collected, as illustrated in FIG. 1.

Figure 2:
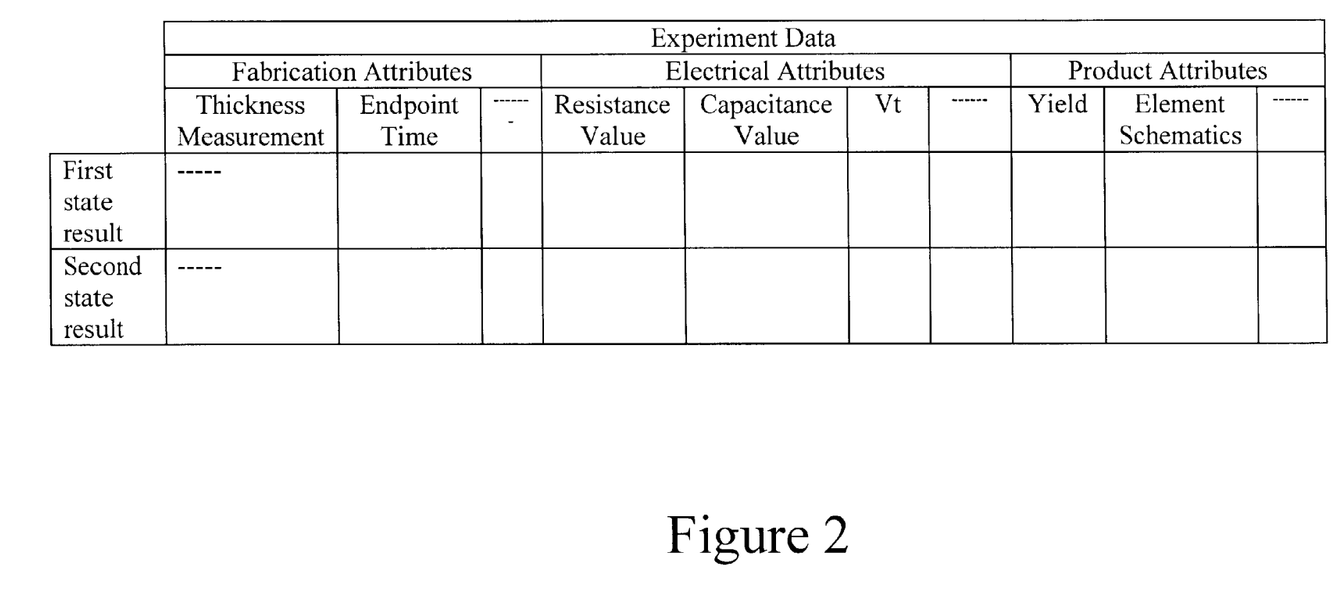
FIG. 2 is an illustration of the first state result and the second state result of one embodiment of this invention.

FIG. 2 is an illustration of the first state result and the second state result in this invention. When fabricating a semiconductor chip, attributes can be grouped into, e.g., manufacturing process attributes, electrical attributes and product attributes. Manufacturing process attributes represent the representative physical test results measured in the manufacturing process, for example, oxidized layer thickness, etching endpoint time, etc. Electrical attributes represent experiment data obtained for component characteristics in WAT measurements, for example, resistance, capacitance, etc. Product attributes represent experiment data obtained in measuring the product such as yields, I/O open chip count, I/O short chip count, etc. The first state result 16a and the second state result 16b can include experiment data for one or more groups of the attributes. See FIG. 2.

Figure 3:
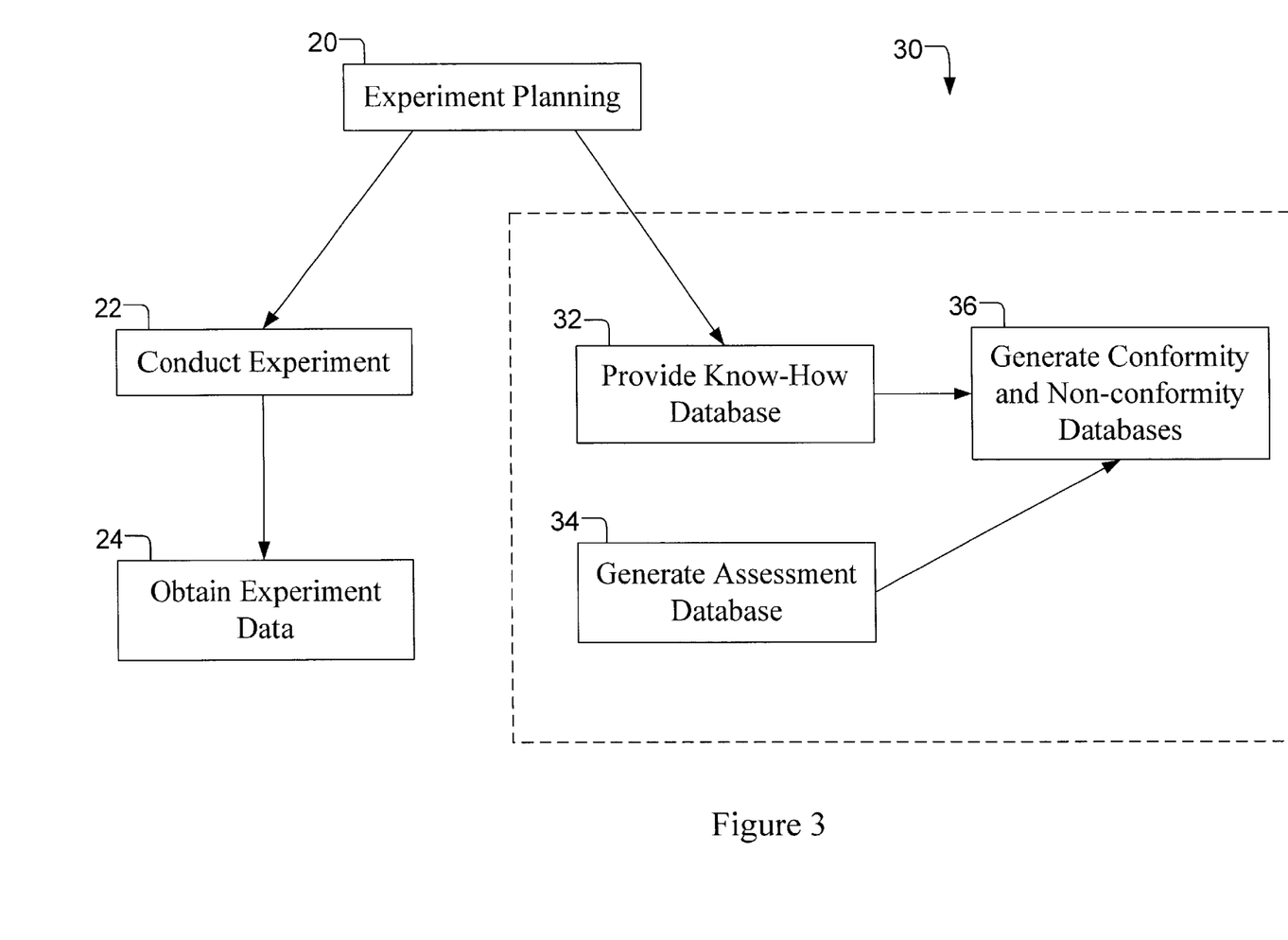
FIG. 3 is a flow chart for experiment execution and a flow chart for the processing methods of one embodiment of this invention.

FIG. 3 is a flowchart illustrating the systems and methods of the present invention. An experimental design 20 is provided. An experimenting process is conducted as shown in 22, and experiment results are obtained in step 24. The experiment results are then analyzed (30), typically by a system which includes a processor, and optionally an associated memory device. An example of the system is a general purposed computer having a processor responsive to a computer readable program code means with instruction means.

The processor may consist of any number of devices including but not limited to, a data processing device such as a microprocessor or microcontroller or a central processing unit, or another logic device such as a DMA (Direct Memory Access) processor, an integrated communication processor device, a custom VLSI (Very Large Scale Integration) device or an ASIC (Application Specific Integrated Circuit) device. The processor can also be any other type of analog or digital circuitry that is designed to perform the processing functions described above.

As described in detail below, FIG. 3 is a flowchart illustrating the methods, systems, and program products according to the invention. It will be understood that each block or step of the flow chart, and combinations of the blocks can be implemented by computer program instructions. An automatic machine can be produced by loading the computer program instructions onto a computer or other programmable apparatus, such that the instructions execute on the computer or other programmable apparatus, and create means for implementing the functions specified in the block diagram or flowchart. Alternatively, the computer program instructions loaded onto the computer or other programmable apparatus can cause a series of operational steps to be performed on the computer or other programmable apparatus. That is, a function specified in the blocks of the block diagram or flow chart can be implemented in steps. The computer program instructions may also be stored in a computer-readable memory device such that a computer or other programmable apparatus can be directed to function in a particular manner to implement the function specified in the block diagram or flowchart.

Numerical representations of experiment data, analysis results and/or database can be stored in a memory device associated with the processor or in the processor itself. Alternatively the numerical representations can be stored elsewhere, such as within the processor, if so desired. Data with known control variables and those attributes known to be determined or affected by the control variables are input into the system as, e.g., numerical representations in a know-how database (block 32), and stored in the memory device or elsewhere.

Figure 4:
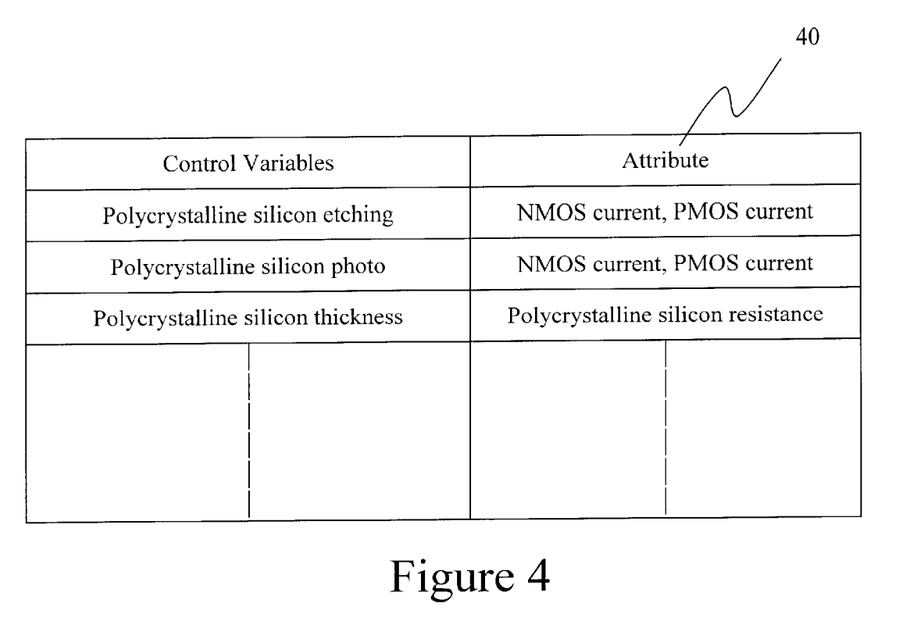
FIG. 4 is a type of know-how database for of one embodiment of this invention.

The know-how database is provided typically based on existing knowledge or previous experiments. For example, if an experienced engineer is aware that the expected changes in polycrystalline silicon photo will have an effect on NMOS current and PMOS current experiment results, then, as illustrated in FIG. 4, the know-how database 40 will show the correlation between the polycrystalline silicon photo (as a control variable) with the attributes NMOS current and PMOS current. Moreover, as experience accumulates, the know-how database can be supplemented and modified to include the correlation between other control variables and the corresponding attributes. For example, the thickness of the polycrystalline silicon can affect the resistance of the polycrystalline silicon, as illustrated in FIG. 4.

Figure 5:
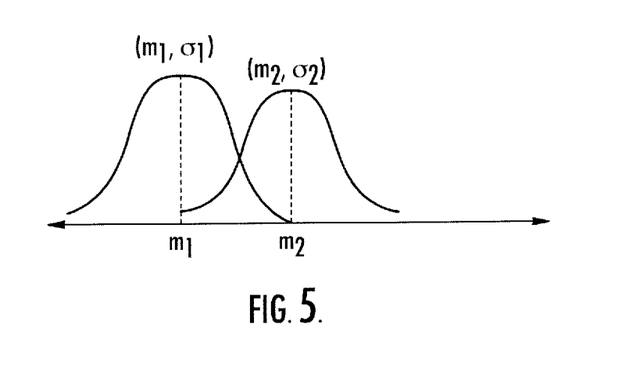
FIG. 5 is a distribution diagram of the experiment data for the first experiment result and the experiment data for the second experiment result for an attribute.

Next, the experiment data from the first and second state results corresponding to each attribute are compared in the system of this invention to produce an assessment database (block 34). Attributes with differences between the experiment data from the first state result and second state result are identified. Typically, differences between the experiment data are only noted for statistically significant differences, i.e., more differences in which a statistical measure such as mean, standard deviation, etc. exceeds a predetermined threshold, as opposed to very slight, insubstantial variations. For example, ANOVA and GLM statistical methods can be used to compare the differences in each attribute in the experiment data in the first state result and the second state result. FIG. 5 is a distribution diagram for the experiment data from the first state result and the experiment data from the second state result for a particular attribute. All experiment data for each attribute in each experiment result can be viewed as a sampling point in one distribution, and they can be redistributed merely by selecting a sufficient number of sampling points, which is also another possible value for one attribute in one experiment result. For example, the experiment data for an attribute in the first state result have a mean value $m_1$ and a standard deviation $\sigma_1$, while the experiment data for one attribute in the second state result have a mean value $m_2$ and a standard deviation $\sigma_2$, as illustrated in FIG. 5. The correlation of the experiment data in the first state result and the second state result for each attribute can be calculated by statistical methods such as ANOVA and GLM. A probability value for each attribute is used to show the degree of difference in the experiment data statistics for one attribute in the first state result and the second state result. Generally, a computer program product having computer readable program code means is used in the statistical analysis of the experiment data. The computer readable program code means can be loaded into a computer or other programmable apparatus, such that the instructions execute on the computer or other programmable apparatus, and create means for analyzing and comparing the first state data and second state data for each attribute.

Figure 6:
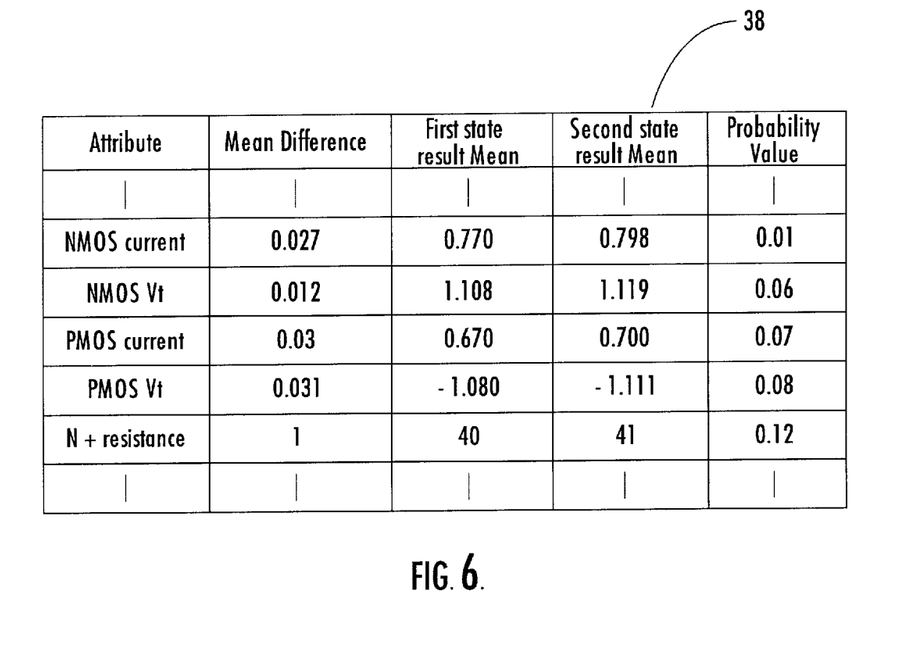
FIG. 6 illustrates a type of assessment database of one embodiment of this invention.

FIG. 6 illustrates an assessment database in this invention. In the assessment database 38, the differences in mean values, mean value for the first state result, mean value for the second state result, and the probability value for each attribute are shown. Typically, a significance level is preset by the computer program product. When the actual probability value for an attribute is smaller than the predetermined significance level, the system of this invention identifies that attribute. For example, when significance level is equal to 0.1, i.e., the predetermined threshold, the attributes of NMOS current, NMOS threshold voltage (VT), PMOS current and PMOS VT having probability values of smaller than 0.1 will be identified in the assessment database.

The assessment database is compared with the know-how database to generate a conformity database and a non-conformity database. Generally, a computer program product having computer readable program code means is used for the purpose of the comparisons. The computer readable program code means can be loaded into a computer or other programmable apparatus, such that the instructions in the computer readable program code means execute on the computer or other programmable apparatus, creating means for analyzing and comparing the assessment database with the know-how database to generate a conformity database and a non-conformity database.

Figure 7A:
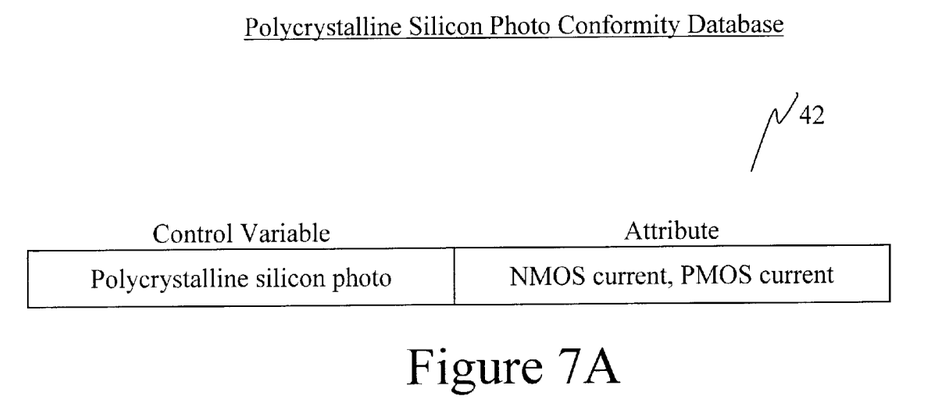
FIG. 7A and FIG. 7B are, respectively, illustrations of a conformity database and a non-conformity database of one embodiment of this invention.
Figure 7B:
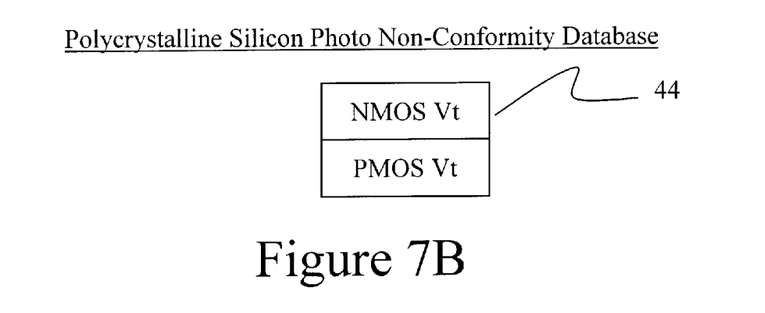

FIG. 7A and FIG. 7B illustrate a conformity database 42 and a non-conformity database 44, respectively. The conformity database 42 contains the attributes in assessment database 38 that appeared in the know-how table 40, i.e., the attributes that produced effects in the experiments and that were expected. For instance, it is clear from the know-how database 40 in FIG. 4 and the assessment database 38 in FIG.

6, that both the NMOS current and the PMOS current are expected to be affected and indeed are affected in the experimenting processes by changes in the polycrystalline silicon photo. Therefore, the NMOS current and PMOS current are included in the conformity database 42. Non-conformity database 44 includes attributes indicated in the assessment database 38 that did not appear in the know-how database 40, indicating that they were not expected to be affected but in fact are affected by the control variable in the experiment. For instance, it is clear from know-how database 40 in FIG. 4 and the assessment database 38 in FIG. 6 that the NMOS VT and PMOS VT attributes are certainly affected by the changes in polycrystalline silicon photo, but were not expected by experienced engineers and, as such, were not included in the know-how database 40. Thus, a special non-conformity database 44 is generated.

Conformity database 42 and non-conformity database 44 provide engineers with simple, accurate, and intuitive information based on which decisions on further investigations can be made. There can be a variety of possibilities leading to an entry in a non-conformity database 44. The inclusion of an attribute in the non-conformity database can result from errors or non-compliance with standard protocols in the manufacturing process. For example, it may be because two semiconductor chips on which the experiment is being performed were not carried out from a station simultaneously or were not placed into the same machine simultaneously, and thus some attributes were unexpectedly altered. Alternatively, the variation in the attribute can be an inherent character of the process that was not previously understood. Further investigation of the cause of the non-conformity is warranted in assuring the product quality and incorporating necessary modifications in the process protocol for improvement purposes.

The know-how database may contain one or more control variables and those attributes expected to be affected by the one or more control variables. When the know-how database contains multiple control variables and the experiments only involve one of the multiple control variables, normally attributes that are expected to be affected by other control variables listed in the know-how database but not the adjusted control variable in the experiments are included in the conformity database.

Know-how database 40 can also be corrected, modified, and expanded based on the experiment results. In the above example, for instance, NMOS VT and PMOS VT should be added to the know-how database 40 as additional attributes expected to be affected by changes of polycrystalline silicon photo. Attributes that are affected by changes in other control variables can also be added. The updated know-how database 40 can be stored in the computer or a related memory device and can be referred to by users, and can also be used as educational material for a new engineer.

The processing method in this invention is also suitable for experiments in which more than two types of states are determined for a control variable to examine the effect on experiment results of different degrees of change in control variables. The method in this invention is also suitable for experimenting in which two or more control variables are adjusted to examine the interaction between the two or more control variables. Simply stated, with the first to nth experiment results ($n \geq 2$), each experiment result represents one type of experimenting condition. Then, statistical methods are used to search for attributes with a probability value smaller than a predetermined significance level, i.e., with significant difference among the results in the n number of experiments. The experiment results are then compared with a know-how database to generate a non-conformity database and a conformity database. This enables one to determine the effects on the experiment results that are produced by different experiment conditions with great efficiency and accuracy.

In the systems, methods, and computer program products of the present invention, experiment analysis can be achieved within a short period of time. Multiple control variables can be experimented simultaneously, and the accuracy is high. Further, the know-how database can be modified and expanded, and can be stored in or be accessible by a computer readable medium, enabling easy access to the database by engineers. Thus, the present invention provides accurate, efficient, versatile systems, methods, and computer program products for analyzing experiment data in a manufacturing process.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system for analyzing a plurality of attributes representing experiment results of a process, said process having a control variable that when changed, alters at least one of the attributes, said system comprising:
    a memory device for storing a know-how database, said database listing attributes that are expected to be affected by changes in said control variable of said process; and
    a processor in communication with said memory device, wherein said processor
        determines which of the plurality of attributes were altered by the change in the control variable;
        compares the altered attributes with the attributes listed in the know-how database;
        identifies the altered attributes that are not listed in the know-how database; and
        stores in a non-conformity database those altered attributes that were not listed in the know-how database.

2. The system of claim 1, wherein said experiment results comprises a first plurality of experiment data generated in said process conducted in a first state of said control variable and a second plurality of experiment data generated in said process conducted in a second state of said control variable, said first and second pluralities of experiment data corresponding to a plurality of attributes of said process, and wherein said processor compares the first and second pluralities of experiment data to generate an assessment database and compares said assessment database with said know-how database.

3. The system of claim 2, wherein said assessment database contains identified attributes having a statistically significant difference in their corresponding experiment data obtained in said process conducted in said first and second state of said control variable.

4. The system of claim 1, wherein said know-how database further contains attributes expected to be affected by changes in a second control variable.

5. The system of claim 1, wherein the know-how database stored in said memory device has electrical attributes, processing attributes, and product attributes.

6. A system according to claim 1, wherein said processor further identifies attributes listed in the know-how database that were not determined by said processor to be altered by the change in the control variable and stores these identified attributes in the non-conformity database.

7. A system according to claim 1, wherein the process comprises a plurality of stations each performing at least one function of the process and having associated therewith at least one control variable, wherein the state of only one variable of one of said stations is changed while the variables of the other stations remain unchanged and said processor determines which of the plurality of attributes were altered by the change in the control variable.

8. A method for analyzing a plurality of attributes representing experiment results obtained in a manufacturing process, said process having a control variable that when changed, alters at least one attribute of the experimental results, said method comprising:

storing a know-how database listing attributes that are expected to be affected by changes in said control variable of said process;

conducting the process in a first state of said control variable to obtain a first plurality of experiment data corresponding to a plurality of attributes of said process;

conducting the process in a second state of said control variable to obtain a second plurality of experiment data corresponding to said plurality of attributes;

comparing said first and second plurality of experiment data to generate an assessment database;

determining which of the plurality of attributes in the assessment database were altered by the change in the control variable;

comparing said assessment database with the know-how database;

identifying altered attributes in the assessment database that are not listed in the know-how database; and storing in a non-conformity database those altered attributes that were not listed in the know-how database.

9. The method of claim 8, wherein the plurality of attributes include electrical attributes, fabrication attributes and product attributes.

10. The method of claim 8, wherein said know-how database further contains attributes expected to be affected by changes in a second control variable.

11. The method of claim 8, wherein comparing said first and second plurality of experiment data comprises identifying attributes having a statistically significant difference in their corresponding experiment data obtained in the process conducted in said first and second states.

12. A method according to claim 8, wherein the process comprises a plurality of stations each performing at least one function of the process and having associated therewith at least one control variable, wherein said conducting the process in a first state and conducting the process in a second state steps conduct the process by altering the state of only one control variable of only one station, while the control variables for each of the other stations remains unchanged.

13. A method for analyzing a plurality of attributes representing experiment results of a process, said process having a control variable that when changed, alters at least one of the attributes, said method comprising:

storing a know-how database listing attributes that are expected to be affected by changes in said control variable of said process;

determining which of the plurality of attributes of the experiment results were altered by the change in the control variable;

comparing the altered attributes with the attributes listed in the know-how database;

identifying the altered attributes that are not listed in the know-how database; and storing in a non-conformity database those altered attributes that were not listed in the know-how database.

14. The computer program product of claim 13, wherein said know-how database further contains attributes expected to be affected by changes in a second control variable.

15. The computer program product of claim 13, wherein said experiment results comprises a first plurality of experiment data generated in said process conducted in a first state of said first control variable and a second plurality of experiment data generated in said process conducted in a second state of said first control variable, said first and second pluralities of experiment data corresponding to a plurality of attributes of said process, and wherein said first computer instruction means compares the first and second pluralities of experiment data to generate an assessment database and said second computer instruction means compares said assessment database with said know-how database.

16. The computer program product of claim 15, wherein said assessment database contains identified attributes having a statistically significant difference in their corresponding experiment data obtained in said process conducted in said first and second state of said control variable.

17. The computer program product of claim 15, further comprising fifth computer instruction means for collecting said first and second pluralities of experiment data.

18. The computer program product of claim 15, wherein said computer instruction means for comparing the first and second plurality of experiment data comprises computer instruction means for identifying attributes having a statistically significant difference in their corresponding experiment data in said first and second plurality of experiment data.

19. A method according to claim 13, wherein said identifying identifies attributes listed in the know-how database that were not determined to be altered by the change in the control variable and said storing stores these identified attributes in the non-conformity database.

20. A method according to claim 13, wherein the process comprises a plurality of stations each performing at least one function of the process and having associated therewith at least one control variable, said method further comprising altering the state of only one variable of one of said stations while the variables of the other stations remain unchanged and said determining step determines which of the plurality of attributes were altered by the change in the control variable.

21. A computer program product for analyzing a plurality of attributes representing experiment results of a process, said process having a control variable that when changed, alters at least one of the attributes, comprising:

a computer readable storage medium having:

a know-how database embodied in said medium listing attributes that are expected to be affected by changes in said control variable of said process; and computer readable program code means embodied in said medium, said computer readable program code means including:

first computer instruction means for determining which of the plurality of attributes were altered by the change in the control variable;

second computer instruction means comparing the altered attributes with the attributes listed in the know-how database;

third computer instructions means for identifying the altered attributes that are not listed in the know-how database; and fourth computer instructions means for storing in a non-conformity database those altered attributes that were not listed in the know-how database.

22. A computer program product according to claim 21, wherein said third computer instruction means further identifies attributes listed in the know-how database that were not determined to be altered by the change in the control variable and stores these identified attributes in the non-conformity database.

23. A computer program product according to claim 21, wherein the process comprises a plurality of stations each performing at least one function of the process and having associated therewith at least one control variable, said computer readable program code means further comprising fifth computer instruction means for altering the state of only one variable of one of said stations while the variables of the other stations remain unchanged and said first computer instruction means determines which of the plurality of attributes were altered by the change in the control variable.

* * * * *

UNITED STATES PATENT AND TRADEMARK OFFICE
CERTIFICATE OF CORRECTION

PATENT NO. : 6,615,157 B1
DATED : September 2, 2003
INVENTOR(S) : Tsai

It is certified that error appears in the above-identified patent and that said Letters Patent is hereby corrected as shown below:

<u>Title page, Item [54] and Column 1, line 1,</u>
Title, after "SYSTEM" insert a comma -- , --.

<u>Title page,</u>
Item [73], Assignees, "ProMos" should read -- ProMOS --.
Item [56], References Cited, U.S. PATENT DOCUMENTS, insert the following:
-- 6,151,532     11/2000         Barone et al. --.

<u>Column 9,</u>
Line 60, "remains" should read -- remain --.

<u>Column 10,</u>
Lines 11-39, in each claim, "The computer program product of" should read -- A method according to --.

<u>Column 11,</u>
Lines 4 and 7, "instructions" should read -- instruction --.

Signed and Sealed this

Twenty-seventh Day of July, 2004

JON W. DUDAS
*Acting Director of the United States Patent and Trademark Office*